United States Patent [19]
Sasaki et al.

[11] Patent Number: 6,118,606
[45] Date of Patent: Sep. 12, 2000

[54] APPARATUS FOR GENERATING A SIGNAL WHOSE PHASE IS SYNCHRONIZED WITH AN INPUTTED DIGITAL SIGNAL

[75] Inventors: Yoshiyuki Sasaki; Shinichi Yamashita, both of Yokohama, Japan

[73] Assignee: Canon Kabushiki Kaisha, Japan

[21] Appl. No.: 08/939,679

[22] Filed: Sep. 29, 1997

Related U.S. Application Data

[63] Continuation of application No. 08/502,561, Jul. 14, 1995, abandoned.

[30] Foreign Application Priority Data

Jul. 19, 1994 [JP] Japan .................................. 6-166741
Jul. 19, 1994 [JP] Japan .................................. 6-166742

[51] Int. Cl.⁷ .............................. G11B 5/09; G11B 5/035
[52] U.S. Cl. ............................................. 360/51; 360/65
[58] Field of Search ........................... 360/32, 33.1, 46, 360/48, 51, 65

[56] References Cited

U.S. PATENT DOCUMENTS

| | | |
|---|---|---|
| 4,627,080 | 12/1986 | Debus, Jr. . |
| 4,700,241 | 10/1987 | Yasuda et al. ............................ 360/51 |
| 5,111,293 | 5/1992 | Yamashita ............................... 358/135 |
| 5,177,649 | 1/1993 | Iwakami et al. ........................ 360/77.14 |
| 5,357,524 | 10/1994 | Shimpuku et al. ....................... 371/30 |
| 5,406,427 | 4/1995 | Shimoda ................................... 360/51 |
| 5,526,200 | 6/1996 | Yada .......................................... 360/51 |

FOREIGN PATENT DOCUMENTS

| | | |
|---|---|---|
| 0330282 | 8/1989 | European Pat. Off. . |
| 0415108 | 3/1991 | European Pat. Off. . |
| 2606575 | 5/1988 | France . |
| 59-92410 | 5/1984 | Japan . |
| 61-283077 | 12/1986 | Japan . |
| 2099663 | 12/1982 | United Kingdom . |

OTHER PUBLICATIONS

European Search Report.

*Primary Examiner*—Glenton B. Burgess
*Assistant Examiner*—Regina Y. Neal
*Attorney, Agent, or Firm*—Fitzpatrick, Cella, Harper & Scinto

[57] ABSTRACT

A specific pattern in an inputted digital signal is detected and the input digital signal is sampled and held in accordance with such a detection output. A clock whose phase is synchronized with the input digital signal is generated on the basis of the sampling output. With such a construction as mentioned above, the phase of the clock can be optimally controlled by a simple construction. The clock can be precisely extracted from the input digital signal, so that the operation of a circuit is also stable.

36 Claims, 15 Drawing Sheets

THRESHOLD LEVEL fb: TRANSMISSION RATE

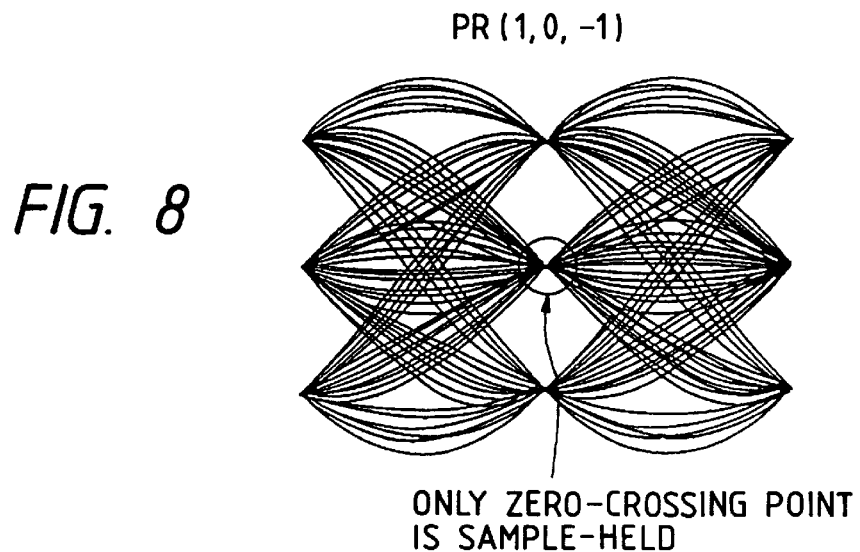
FIG. 8
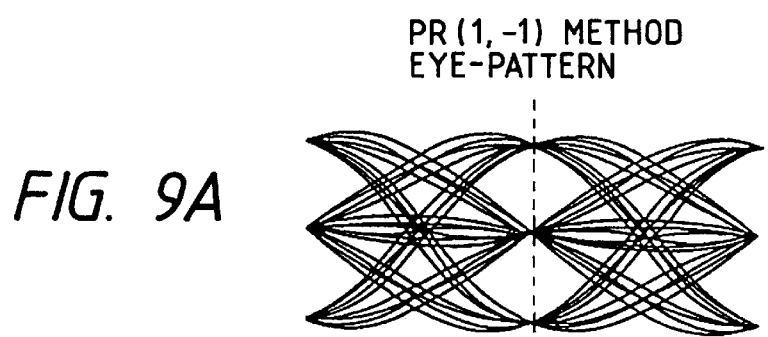
FIG. 9A
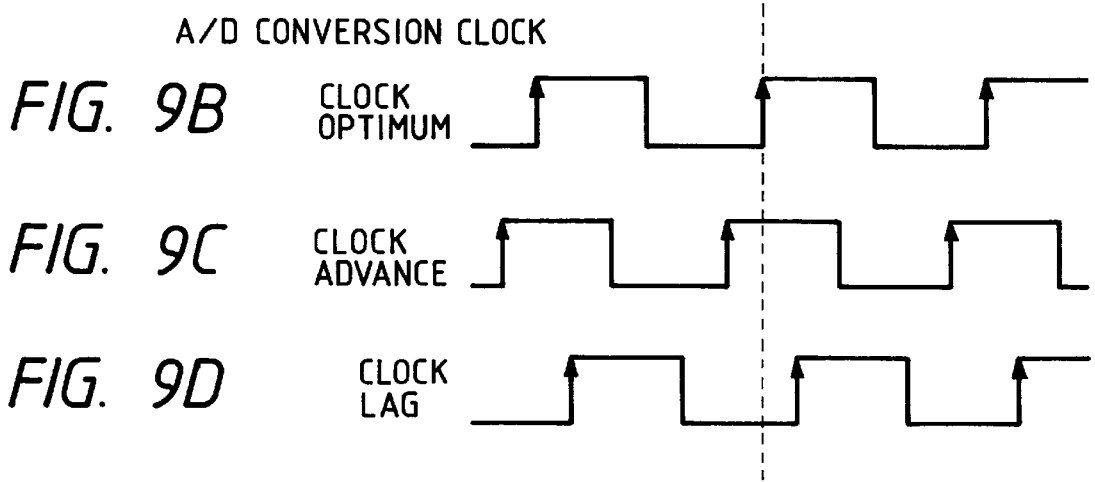
FIG. 9B
FIG. 9C
FIG. 9D

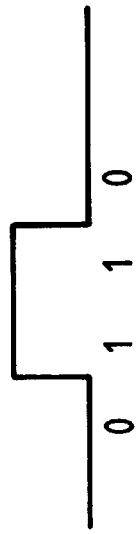
FIG. 11A RECORDING SIGNAL
FIG. 11B REPRODUCTION EQUALIZER OUTPUT (INTEGRATING METHOD)
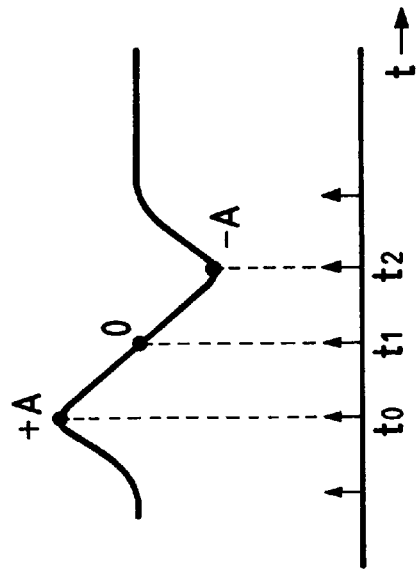
FIG. 11C PR(1,−1) EQUALIZER OUTPUT
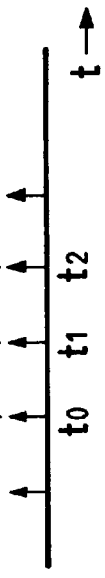
FIG. 11D A/D CONVERSION CLOCK (OPTIMUM PHASE)
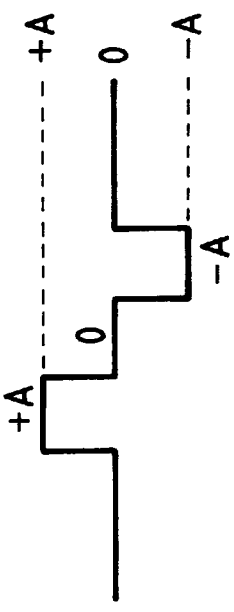
FIG. 11E A/D CONVERSION DATA

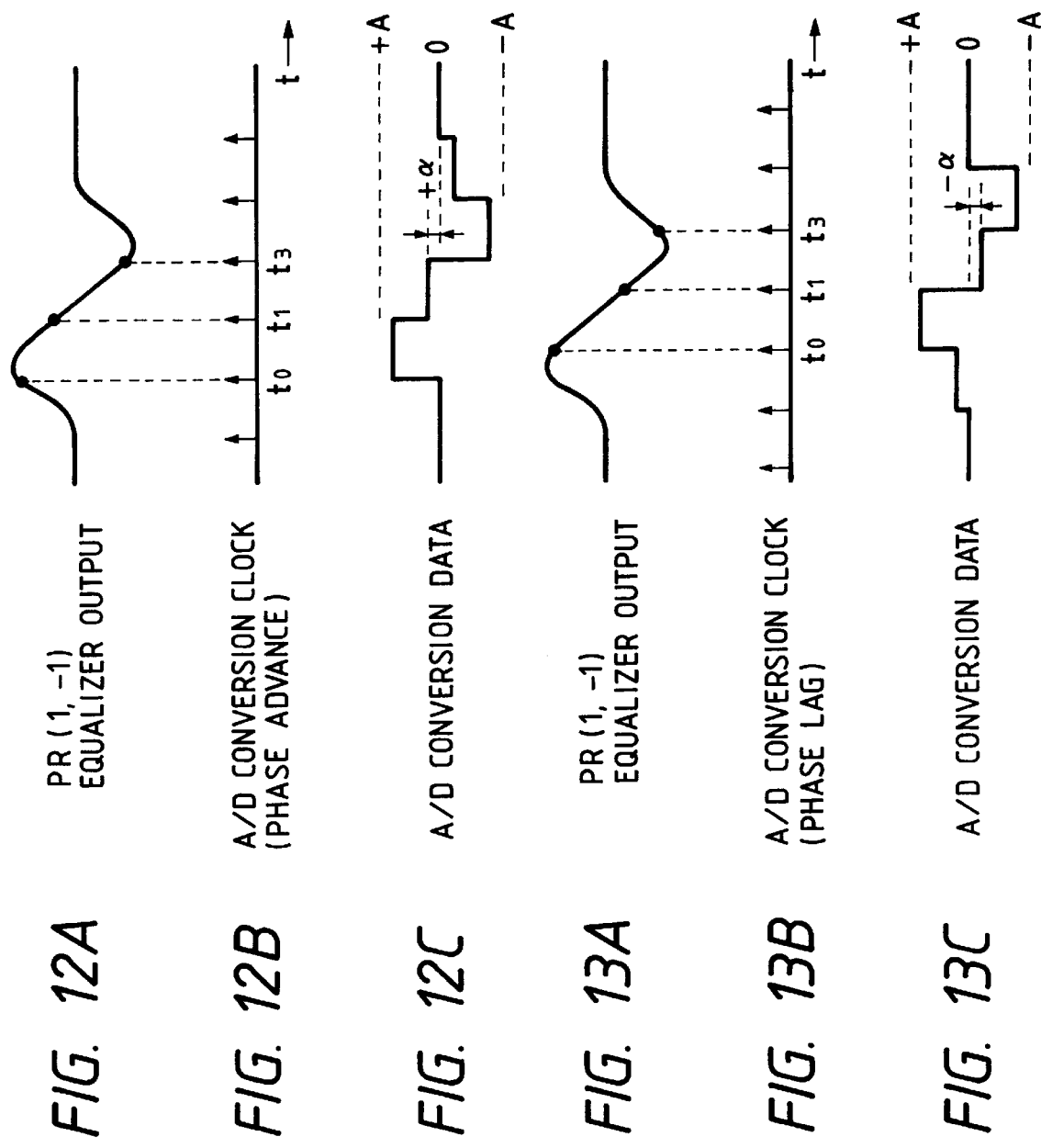

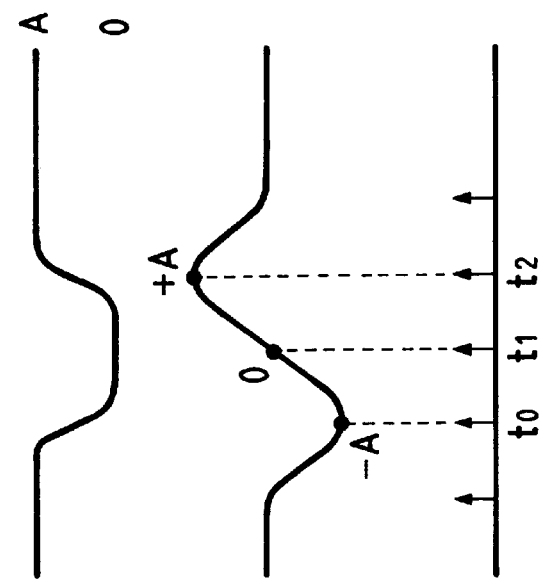
FIG. 14A  RECORDING SIGNAL
FIG. 14B  REPRODUCTION EQUALIZER (INTEGRATING METHOD)
FIG. 14C  PR (1, -1) EQUALIZER OUTPUT
FIG. 14D  A/D CONVERSION CLOCK
FIG. 14E  A/D CONVERSION DATA

FIG. 17

TRUTH TABLE OF s AND h

| e | d | c | b | a | b | - | d | s | h |
|---|---|---|---|---|---|---|---|---|---|
| 0 | 0 | 0 | 0 | 0 | 0 | 0 | 0 | * | 1 |
| 0 | 0 | 0 | 0 | 1 | 0 | 0 | 1 | + | 0 |
| 0 | 0 | 0 | 1 | 0 | 0 | 1 | 0 | * | 1 |
| 0 | 0 | 0 | 1 | 1 | 0 | 1 | 1 | * | 1 |
| 0 | 0 | 1 | 0 | 0 | 1 | 0 | -1 | — | 0 |
| 0 | 0 | 1 | 0 | 1 | 1 | 0 | 0 | — | 0 |
| 0 | 0 | 1 | 1 | 0 | 1 | 1 | -1 | * | 1 |
| 0 | 0 | 1 | 1 | 1 | 1 | 1 | 0 | * | 1 |
| 0 | 1 | 0 | 0 | 0 | 0 | -1 | 0 | * | 1 |
| 0 | 1 | 0 | 0 | 1 | 0 | -1 | 1 | * | 1 |
| 0 | 1 | 0 | 1 | 0 | 0 | 0 | 0 | * | 1 |
| 0 | 1 | 0 | 1 | 1 | 0 | 0 | 1 | + | 0 |
| 0 | 1 | 1 | 0 | 0 | 1 | -1 | -1 | * | 1 |
| 0 | 1 | 1 | 0 | 1 | 1 | -1 | 0 | * | 1 |
| 0 | 1 | 1 | 1 | 0 | 1 | 0 | -1 | — | 0 |
| 0 | 1 | 1 | 1 | 1 | 1 | 0 | 0 | — | 0 |
| 1 | 0 | 0 | 0 | 0 | -1 | 0 | 0 | + | 0 |
| 1 | 0 | 0 | 0 | 1 | -1 | 0 | 1 | + | 0 |
| 1 | 0 | 0 | 1 | 0 | -1 | 1 | 0 | * | 1 |
| 1 | 0 | 0 | 1 | 1 | -1 | 1 | 1 | * | 1 |
| 1 | 0 | 1 | 0 | 0 | 0 | 0 | -1 | — | 0 |
| 1 | 0 | 1 | 0 | 1 | 0 | 0 | 0 | * | 1 |
| 1 | 0 | 1 | 1 | 0 | 0 | 1 | -1 | * | 1 |
| 1 | 0 | 1 | 1 | 1 | 0 | 1 | 0 | * | 1 |
| 1 | 1 | 0 | 0 | 0 | -1 | -1 | 0 | * | 1 |
| 1 | 1 | 0 | 0 | 1 | -1 | -1 | 1 | * | 1 |
| 1 | 1 | 0 | 1 | 0 | -1 | 0 | 0 | + | 0 |
| 1 | 1 | 0 | 1 | 1 | -1 | 0 | 1 | + | 0 |
| 1 | 1 | 1 | 0 | 0 | 0 | -1 | -1 | * | 1 |
| 1 | 1 | 1 | 0 | 1 | 0 | -1 | 0 | * | 1 |
| 1 | 1 | 1 | 1 | 0 | 0 | 0 | -1 | — | 0 |
| 1 | 1 | 1 | 1 | 1 | 0 | 0 | 0 | * | 1 |

* DENOTES THAT EITHER OF SIGNS WILL DO

APPARATUS FOR GENERATING A SIGNAL WHOSE PHASE IS SYNCHRONIZED WITH AN INPUTTED DIGITAL SIGNAL

This application is a continuation of application Ser. No. 08/502,561 filed Jul. 14, 1995, now abandoned.

BACKGROUND OF THE INVENTION

1. Field of the Invention

The present invention relates to a digital signal processing apparatus and, more particularly, to an apparatus for generating a signal whose phase is synchronized with a digital signal inputted.

2. Related Background Art

Hitherto, as such a kind of apparatus, there has been known a digital VTR for converting a video signal to a digital signal and for recording or reproducing the signal onto/from a magnetic tape.

FIG. 1 is a block diagram showing a construction of a reproducing system in such a digital VTR.

In FIG. 1, reference numeral 1 denotes a magnetic tape; 2 a magnetic head for recording or reproducing a signal to/from the magnetic tape 1; 3 a head amplifier for amplifying a reproduced signal of the magnetic head 1; 4 a reproduction equalizer which has predetermined frequency characteristics to equalize an output of the head amplifier 3 and which is constructed by an LC network and the like; 18 a data detection circuit for converting an output signal of the reproduction equalizer 4, namely, a signal whose amplitude is changed in an analog manner to a digital signal again; 20 a PLL circuit for generating a clock synchronized with an output of the data detection circuit 18; 19 a sample-hold circuit for sampling and holding an output of the data detection circuit 18 by the clock that is generated from the PLL circuit 20; 9 a demodulator for demodulating the data which was sampled and held; 10 an error correction decoding circuit for correcting errors by detecting errors included in the demodulated reproduced data by using parity data added upon recording; 11 a reproduced signal processing circuit for performing a signal process which is almost opposite to a signal process at the time of the recording to the error corrected data, thereby decoding an encoded video signal and extending an information amount; and 12 a D/A converter for converting the signal processed data to the analog signal.

The operation will now be described. The micro reproduced signal obtained from the magnetic head 2 by reproducing the magnetic tape 1 on which video image data has been recorded is amplified to 50 to 60 Db by the head amplifier 3.

The frequency characteristics of the reproduced signal amplitude of the magnetic head 2 frequency characteristics of a magnetic recording and reproducing system as shown in FIG. 2, they are differentiating characteristics in a low frequency band and are attenuating characteristic in a high frequency band due to various losses. In the reproduction equalizer 4, the characteristics of the magnetic recording and reproducing system are compensated by using characteristics shown in FIG. 3 which are opposite to those in FIG. 2, thereby correcting the above reproduced signal amplitude. Such a method is an equalizing method called an integrating method.

An output waveform of the reproduction equalizer 4 of the foregoing integrating method becomes an eye-pattern waveform as shown in FIG. 4. A waveform of such an eye-pattern is converted by using a comparator or the like in which a threshold level is selected at a position near the center by the data detection circuit 18, thereby deriving reproduced digital data.

The PLL circuit 20 generates a clock synchronized with the reproduced digital data. The sample-hold circuit 19 samples and holds the above reproduced digital data by using such a clock. The sampled and held data is demodulated by the demodulator 9. Further, errors of such demodulated data are corrected by the error correction decoding circuit 10 by using an error correction parity added at the time of the recording. In the reproduced signal processing circuit 11, a signal process which is almost opposite to the signal process upon recording of the data is executed. The processed signal is D/A converted by the D/A converter 12, thereby obtaining a reproduced video image signal.

In recent years, as an equalizing method of a reproduction equalizer which is used in a VTR for recording at a high density, a system using an inter-code interference of a reproduced waveform called a partial response system (PR method) is being developed.

In order to reduce reproduction errors, a technique in which such a system is combined with the Viterbi decoding method for detecting data by using a correlation of a reproduced signal in the direction of a time base is becoming a main stream nowadays.

FIG. 5 is a block diagram of a reproducing system of a digital VTR using a PR(1, −1) method and a Viterbi decoder among the above partial response methods.

In FIG. 5, reference numeral 5 denotes a delay circuit for delaying the output of the reproduction equalizer 4 by a time corresponding to one bit; 6 a subtracter for subtracting a delay output from the output of the reproduction equalizer 4; 7 an A/D converter for converting a subtraction output to digital data of a plurality of bits per one sample by the A/D conversion clock from the PLL circuit 20; and 8 a Viterbi decoder for converting the A/D conversion output to the digital data of one bit per one sample by using a Viterbi algorithm.

In this instance, an equalizer of the PR(1, −1) method is constructed by the 1-bit delay circuit 5 and subtracter 6. Transmission characteristics of a transmission path are characteristics for suppressing a low frequency component as shown in FIG. 6.

In recent years, a metal evaporation deposited tape (ME tape) has been being developed in order to record at a high density. According to the characteristics of the ME tape, a high frequency output is higher than that of a conventional metal painting type tape (MP tape) by a few dB, however, what is called a vertical component of residual magnetization is strong depending on a convenience in a manufacturing procedure. The low frequency component especially becomes a cause of a waveform distortion. To prevent such a distortion, the partial response method is used.

Subsequently, an output of the subtracter 6 is A/D converted by the A/D conversion clock obtained from the PLL circuit 20 by the A/D converter 7, thereby detecting data having few error by using a correlation in the direction of the time base of the reproduced signal by the Vitierbi decoder 8. The detected data is added to the demodulator 9 and subsequent processes are executed in a manner similar to those in FIG. 1. A detailed description with respect to the operation of the Viterbi decoder 8 is omitted here.

The partial response system as mentioned above is not limited to the PR(1, −1) method, but a PR(1, 0, −1) method is also considered.

A reproducing system of a digital VTR using the PR(1, 0, −1) method will now be described hereinbelow.

FIG. 7 is a block diagram showing a construction of the reproducing system of such a digital VTR. The construction up to the equalization of the reproduced signal by the reproduction equalizer 4 is substantially the same as that in FIG. 5.

In FIG. 7, the delay circuit 5 delays the digital signal from the A/D converter 7 by a time corresponding to two bits.

Reference numeral 20a denotes a phase comparator for detecting a phase difference between the output signal of the reproduction equalizer 4 and an output clock of a VCO (voltage controlled oscillator) 20c, which will be described hereinlater; 20b a loop filter for amplifying an, output of the phase comparator 20a, for returning the amplified output to the VCO 20c, and for obtaining predetermined PLL loop response characteristics; 20c the VCO for supplying a sampling clock to Viterbi decode a PR(1, 0, −1) signal and an operation clock of another circuit to the A/D converter 7.

The above phase comparator 20a, loop filter 20b, and VCO 20c construct the PLL circuit 20.

The operation will now be described.

The signal which was reproduced and was equalized by the reproduction equalizer 4 as mentioned above is outputted to the A/D converter 7 and phase comparator 20a.

In the PLL circuit 20, a phase difference between a clock generated by the VCO 20c and the output signal of the reproduction equalizer 4 is detected by the phase comparator 20a. The phase difference signal is inputted to the VCO 20c through the loop filter 20b, thereby performing a phase lock so that the phase difference is almost equal to 0. Frequency characteristics and a gain of the loop filter 20b, a sensitivity of the VCO 20c, and the like are set so that phase response characteristics of the PLL circuit can sufficiently absorb jitters which occur by a head tape system of the VTR and become hard to respond to various noises.

The PLL circuit is constructed as mentioned above and the phase of the lock of the PLL circuit is adjusted by, for example, adjusting the operation point of the phase comparator 20a or the like, so that a point at which an eye aperture becomes maximum can be sampled.

The equalized signal is sampled and digitized by the A/D converter 7 which is controlled by the clock generated by the PLL circuit. The digitized reproduced signal is delayed by the delay circuit 5 and is subtracted from the original signal by the subtracter 6. The integrated equalized waveform is converted to a waveform having PR(1, 0, −1) characteristics by the above operation and its eye-pattern has three values as shown in FIG. 8. Such a PR(1, 0, −1) signal is maximum likelihood decoded by the Viterbi decoder 8.

The combination of the PR(1, 0, −1) method and the Viterbi decoding is often used for a digital VTR using a high density magnetic recording or the like and can avoid bad low frequency band characteristics (S/N ratio, waveform distortion, and the like) of the magnetic recording system and can hold transmission errors minimum. Errors which occurred in the transmission path in the reproduced data decoded by the Viterbi decoder 8 are corrected by the error correction decoding circuit 10. The error corrected data is converted to the image signal of the original format by the reproduced signal processing circuit 11 and is converted to the analog image signal by the D/A converter 12 and is outputted as a reproduced image signal of the VTR. An output of the VCO 20c is also used as an operation clock of the circuits other than the A/D converter 7.

The conventional digital VTR is constructed as mentioned above. The reproduced eye-pattern of the equalizer output of the PR(1, −1) method shown in FIG. 5 has a waveform as shown in FIG. 9A. In such an eye-pattern, as shown in the diagram, a window width in the direction of the time base is narrower as compared with that of the integrating method in FIG. 4. In case of A/D converting, therefore, when the phase of the A/D conversion clock added to the A/D converter 7 from the PLL circuit 20 is deviated from the optimum position in FIG. 9B to a position as shown in FIG. 9C or 9D, there is a problem such that the reproduced errors rapidly increase.

In the conventional example, the apparatus is constructed in a manner such that a clock such as a sampling clock or the like of the A/D converter 7 is extracted from the analog signal which is generated from the reproduction equalizer 4 by the PLL circuit and the reproduced signal equalized by the reproduction equalizer 4 is sampled by the extracted clock. Generally, however, in the PLL circuit constructed in an analog manner, especially, in the case where a quality of the reproduced signal is low and the signal is reproduced at a high speed as in the digital VTR, there are problems such that it is difficult to hold a stability, it is necessary to adjust a sampling phase, and the like.

SUMMARY OF THE INVENTION

It is an object of the invention to solve the above problems.

Another object of the invention is to provide an apparatus which can optimally control a phase of a clock which is generated by using an input digital signal.

To accomplish the above objects, according to an aspect of the invention, there is provided a digital signal processing apparatus comprising input means for inputting a digital signal, detecting means for detecting a specific pattern in the input digital signal, sampling means for sampling and holding the input digital signal in accordance with an output of the detecting means, and generating means for generating a clock whose phase is synchronized with the input digital signal in accordance with an output of the sampling means.

Still another object of the invention is to provide an apparatus which can extract a clock from an input signal at a high precision and in which the operation is stable.

To accomplish such an object, according to an aspect of the invention, there is provided a digital signal processing apparatus comprising converting means for sampling an input signal whose amplitude changes in an analog manner and converting it to a digital signal detecting means for detecting a specified pattern in the digital signal by using data of continuous N samples (N≧3) in the digital signal converted by the converting means, and generating means for generating a clock whose phase is synchronized with the input signal in accordance with an output of the detecting means, wherein the converting means executes the converting operation in accordance with the clock signal.

The above and other objects and features of the present invention will become more apparent from the following detailed description and the appended claims with reference to the accompanying drawings.

BRIEF DESCRIPTION OF THE DRAWINGS

FIG. 8 is a diagram showing a waveform of a signal after completion of the PR(1, 0, −1) process;

FIGS. 9A to 9D are diagrams showing states of phases between a waveform of a reproduced signal and reproduced clocks;

FIGS. 11A to 11E are diagrams showing states of signals of sections in FIG. 10;

FIGS. 12A to 12C are diagrams showing states of the signals of the sections in FIG. 10;

FIGS. 13A to 13C are diagrams showing states of the signals of the sections in FIG. 10;

FIGS. 14A to 14E are diagrams showing states of the signals of the sections in FIG. 10;

FIG. 17 is a diagram for explaining the operation of the circuit in FIG. 16;

DETAILED DESCRIPTION OF THE PREFERRED EMBODIMENTS

Embodiments of the invention will now be described.

Figure 1:
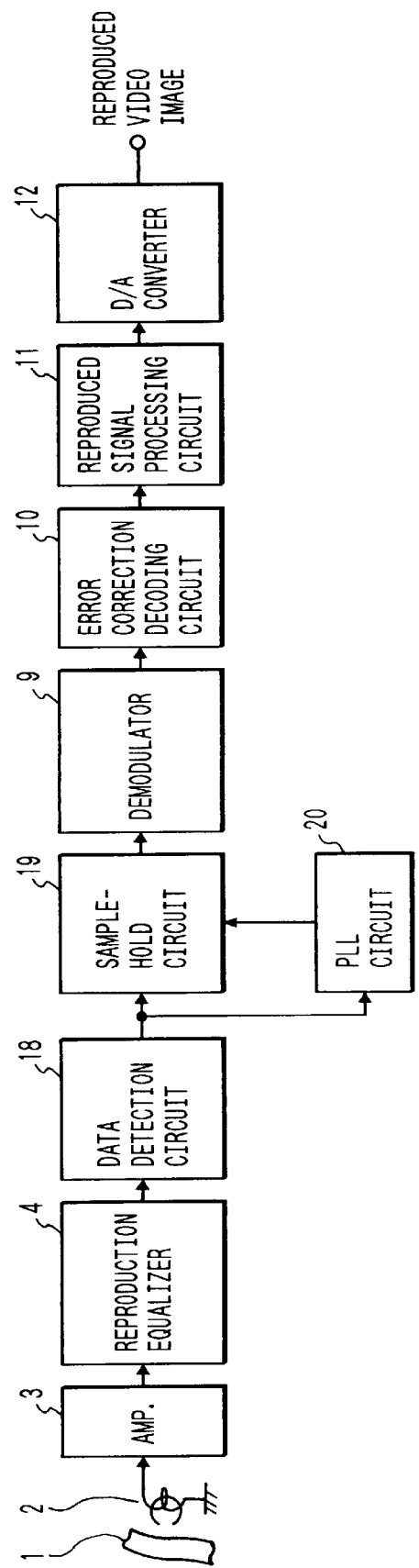
FIG. 1 is a diagram showing a construction of a conventional digital VTR.
Figure 2:
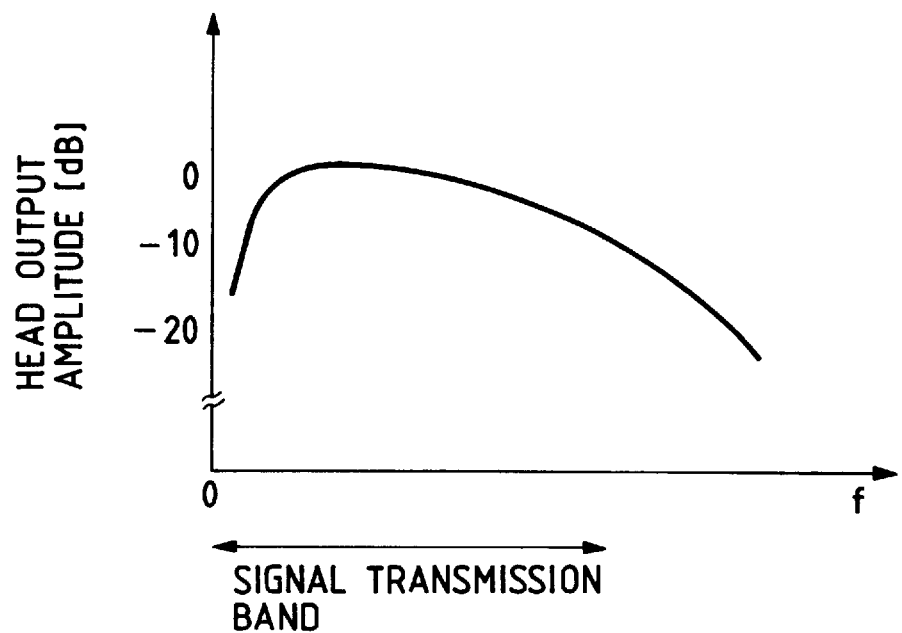
FIG. 2 is a diagram showing characteristics of a magnetic recording and reproducing system.
Figure 3:
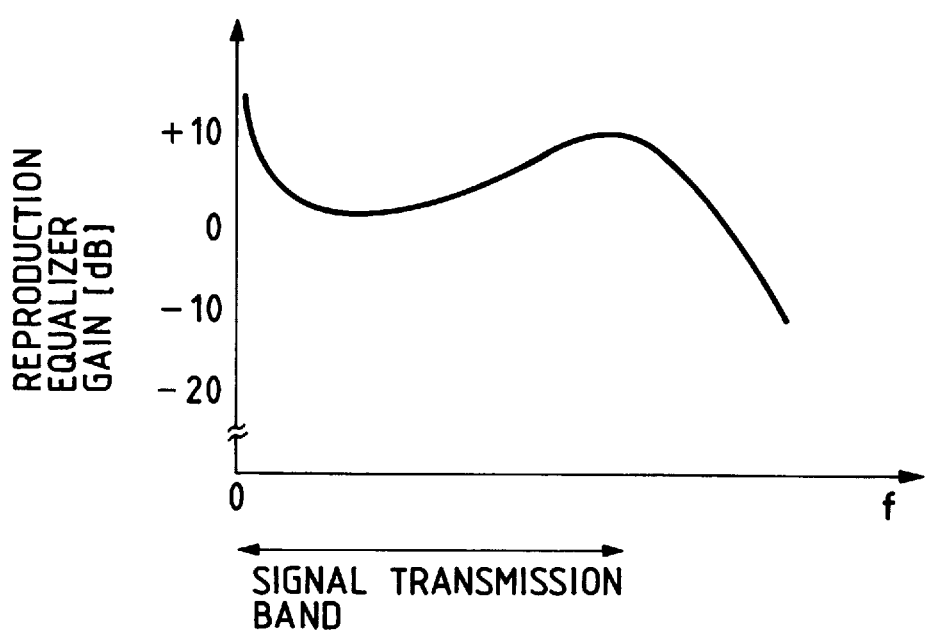
FIG. 3 is a diagram showing reproduction equalizing characteristics.
Figure 4:
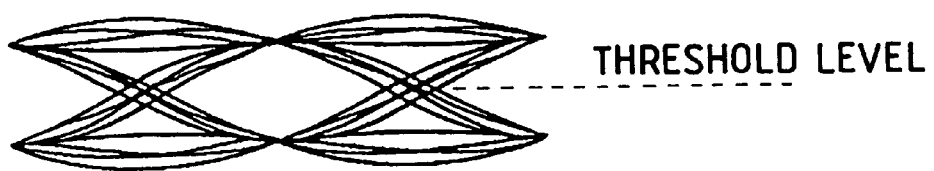
FIG. 4 is a diagram showing a waveform of a reproduced signal after completion of the equalization.
Figure 6:
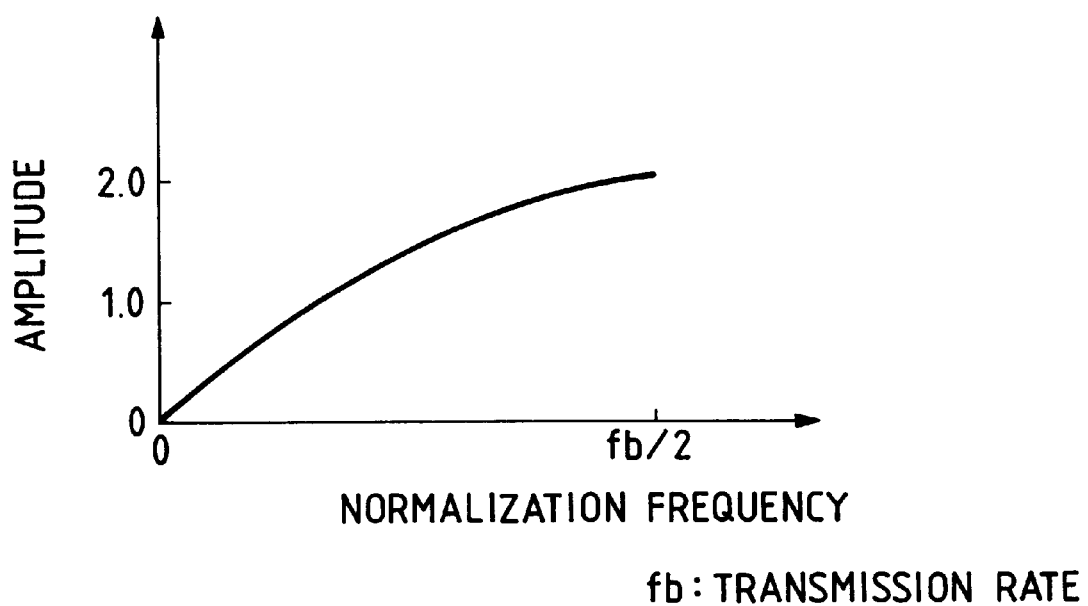
FIG. 6. is a diagram showing transmitting characteristics of an equalizer of a PR(1, −1) method.
Figure 5:
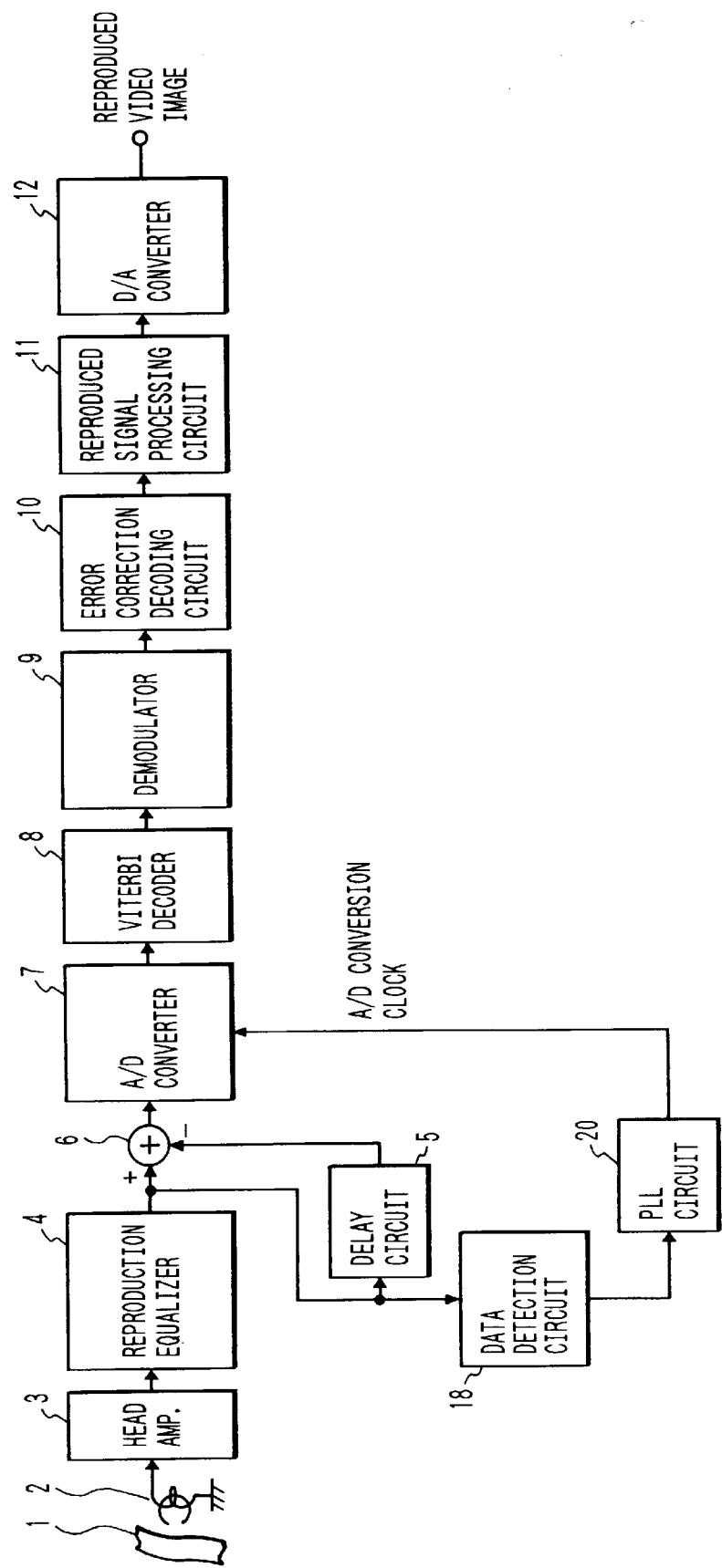
FIG. 5 is a diagram showing another construction of a conventional digital VTR.

First, a case where the invention is applied to an apparatus which performs a process of PR(1, −1) to a reproduced signal and A/D converts the processed signal, thereby obtaining a reproduced video signal in a manner similar to the apparatus shown in FIG. 5.

Figure 10:
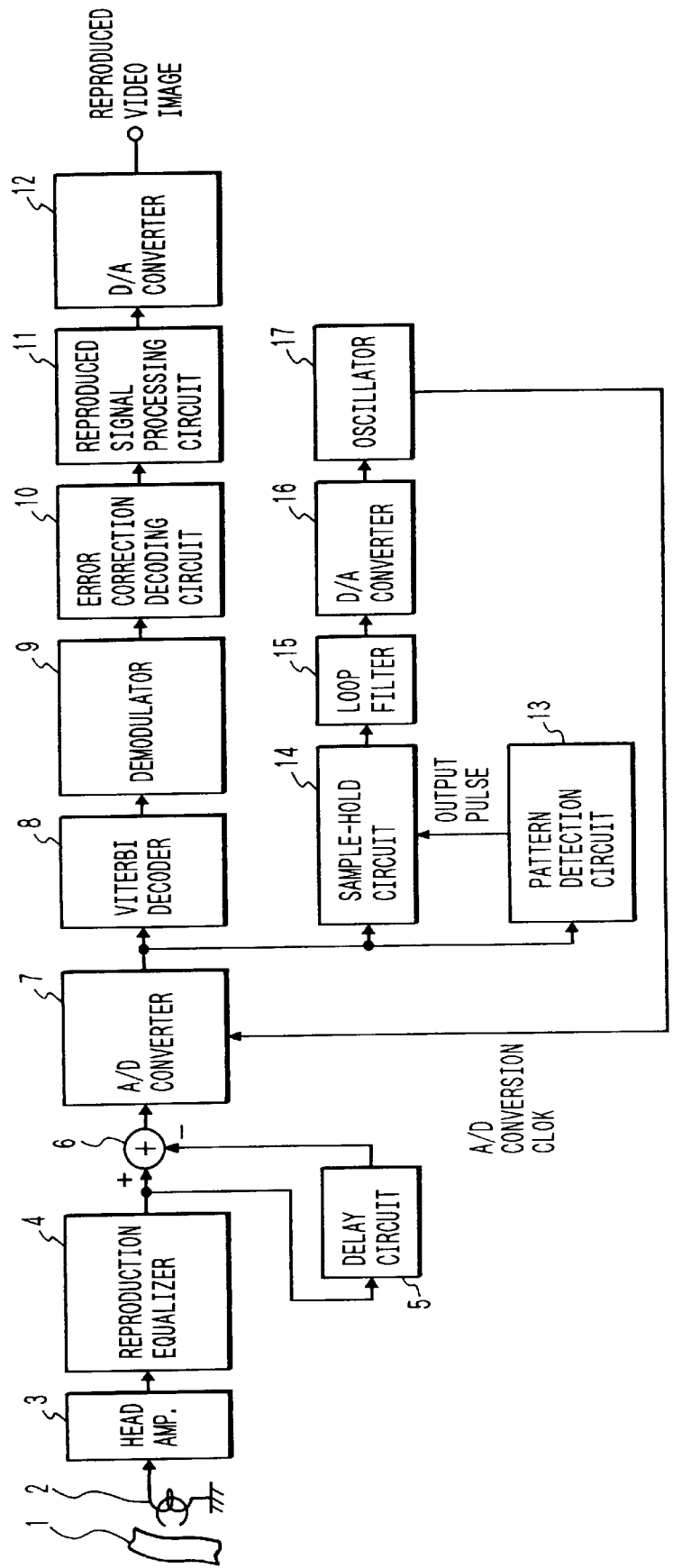
FIG. 10 is a diagram showing a construction of a digital VTR as an embodiment of the invention.

FIG. 10 is a block diagram showing a construction of a reproducing system of a digital VTR as an embodiment of the invention. The same portions as those in FIG. 5 are designated by the same reference numerals and their explanations are omitted.

In FIG. 10, reference numeral 13 denotes a pattern detection circuit for detecting a specific data pattern which output data of the A/D converter 7 obtains on a time series; 14 a sample-hold circuit for sampling and holding the output data of the A/D converter 7 by a detection output of the pattern detection circuit 13; 15 a loop filter comprising a low pass filter for performing a filter process to an output of the sample-hold circuit 14; 16 a D/A converter for D/A converting an output of the loop filter 15; and 17 an oscillator comprising a VCO (voltage controlled oscillator) whose oscillating frequency is controlled by an output voltage of the D/A converter 16.

An oscillation output of the oscillator 17 is supplied to the A/D converter 7 as an A/D conversion clock. A center frequency of the oscillator 17 is selected so as to be almost equal to a data transmission rate.

The operation by the above construction will now be described.

It is now assumed that a recording signal has a data pattern of ( . . . , 0110, . . . ) as shown in FIG. 11A. When the signal is recording and reproduced to/from the magnetic tape 1 by the magnetic head 2, an output of the reproduction equalizer 4 of the integrating type at the time of the reproduction has a waveform as shown in FIG. 11B. When the output of the reproduction equalizer 4 is transmitted through an equalizer of the PR(1, −1) method comprising the delay circuit 5 and subtracter 6, as shown in FIG. 11C, an output signal of the equalizer has vralues such as +A, 0, and −A at three time points $t_0$, $t_1$, and $t_2$, respectively, so as to decrease in one direction.

Such a waveform is sampled at a leading edge of the A/D conversion clock from the oscillator 17 and is A/D converted by the A/D converter 7. When the data after completion of the A/D conversion is expressed in an analog manner, in the case where a phase of the A/D conversion clock is optimum, it has values of +A, 0, and −A as shown in FIG. 11E and is equal to 0 at the center time point $t_1$.

When the phase of the A/D conversion clock advances, the A/D conversion data has values as shown in FIG. 12C. In this instance, it will be understood that the value of the center time point $t_1$ among three time points is not equal to 0 but is changed to +α. Similarly, when the phase of the A/D conversion clock lags, the value at the time point $t_1$ is changed to −α as shown in FIG. 13C.

This means that in the case where a signal of a specific data pattern such as ( . . . , 0110, . . . ) was recorded and reproduced, the pattern detection circuit 13 detects that the equalizer output of the PR(1, −1) method has a pattern which decreases in one direction at three points on the time series. When a value corresponding to the time point $t_1$ is sampled and held by the sample-hold circuit 14 in accordance with the detection, phase detection data indicative of the phase of the A/D conversion clock is directly obtained as a sampling output. When a specific data pattern is detected, the pattern detection circuit 13 generates a latch pulse to latch the value at the center time point $t_1$.

After the output of the sample-hold circuit 14 as phase detection data was subjected to the filter process by the loop filter 15, the processed output signal is D/A converted by the D/A converter 16 and the output voltage is negatively returned to the oscillator 17 of the VCO and the oscillating frequency is controlled, so that there is a PLL circuit in which a phase of the A/D conversion clock is optimized.

In the above embodiment, although the example using a pattern in which a reproduction waveform decreases in one direction has been explained by using the pattern ( . . . , 0110, . . . ) as a specific data pattern to be recorded, a signal such as ( . . . , 1001, . . . ) is recorded as shown in FIG. 14A and a data pattern increasing in one direction at the time of the reproduction as shown in FIG. 14C is used, or the like, various data patterns can be used. For example, when the apparatus is constructed in a manner such that a pattern of a high appearance probability such as a sync pattern is used in accordance with a modulating method upon recording and such a pattern is detected, a further large effect can be obtained.

Although the above embodiment has been described above with respect to the example in which the equalizer of the PR(1, −1) method has been constructed by the analog circuit, when the equalizer is constructed by a digital circuit and is provided at the post stage of the A/D converter 7, the operation similar to that of the above embodiment can be expected. Such a construction will be described hereinlater.

Although the example in which the invention was applied to the digital VTR has been explained in the above embodiment, even when the invention is applied to a data processing apparatus using another transmission path such as satellite communication, optical fiber communication, or the like, the operation similar to that of the above embodiment can be expected.

In the embodiment, although the input digital signal itself has been latched in accordance with the output of the pattern detection circuit 13, the invention is not limited to such a construction but can be also applied to a construction such that, in accordance with the detection of the pattern, differences between values at time points $t_1$ in FIGS. 12A and 13A and the 0 level, namely, +α and −α are obtained and outputted to the loop filter.

Further, in the embodiment, although the output of the oscillator 17 has been used by only the A/D converter 7, the invention is not limited to the above construction. Since the output of the oscillator 17 is synchronized with the output digital signal of the A/D converter 7, it can be also used as an operation clock of another circuit in the apparatus.

Since the phase detection output is directly obtained from the input digital signal, a stability of the PLL circuit to form the clock can be improved and a non-adjustment can be realized.

As described above, in the embodiment, since the specific pattern in the input digital signal is detected and the clock is generated on the basis of the control signal formed by using the digital signal extracted in response to the detection timing, there is an effect such that the clock synchronized with the phase of the input digital signal can be formed.

By using the clock formed as mentioned above as a clock at the time of, for example, the A/D conversion, even in the case where a window width in the direction of the time base of the eye-pattern is narrow as in the partial response system, since the phase of the A/D conversion clock can be optimized, there is an effect such that reproduction errors can be reduced.

Subsequently, a case where the invention is applied to an apparatus in which, after a reproduced signal was A/D converted, the converted signal is subjected to a process of PR(1, 0, −1), thereby obtaining a reproduced video signal will now be explained.

Figure 15:
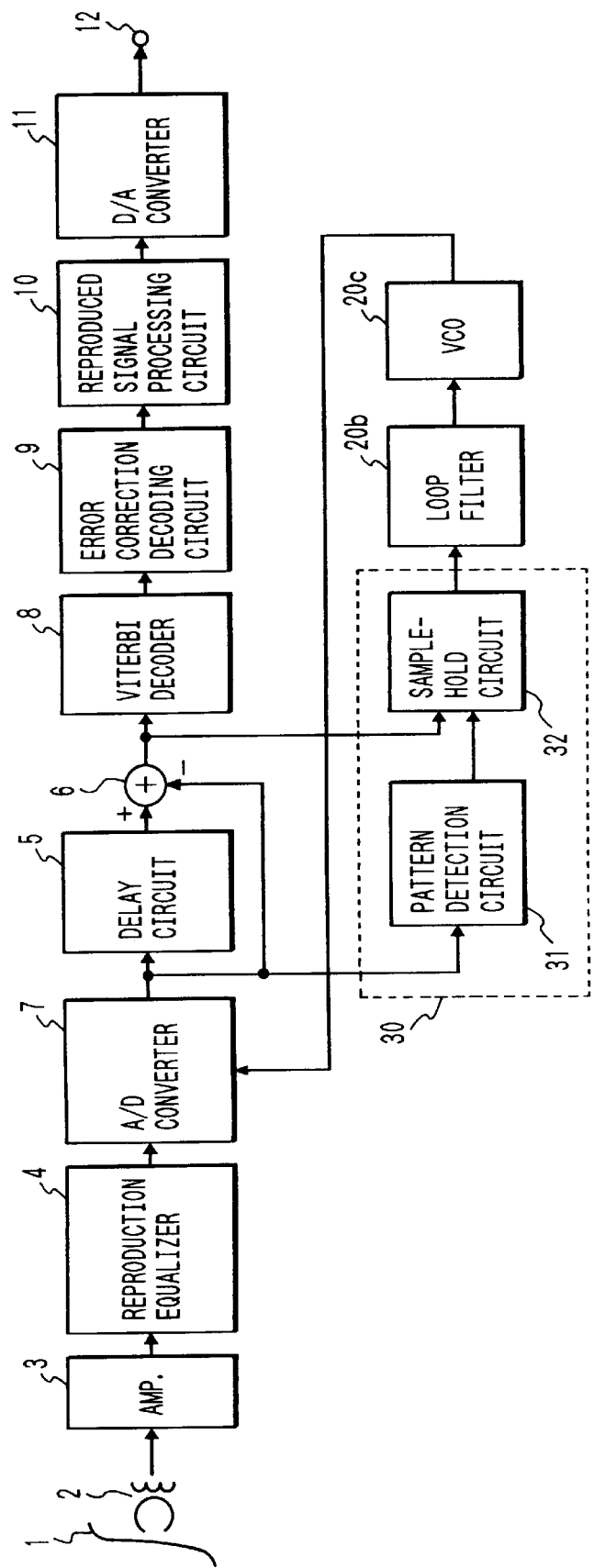
FIG. 15 is a diagram showing another construction of a digital VTR as an embodiment of the invention.

FIG. 15 is a block diagram showing a construction of a digital VTR as another embodiment of the invention. The same portions as those in FIGS. 5 and 7 are designated by the same reference numerals and their explanations are omitted.

Figure 7:
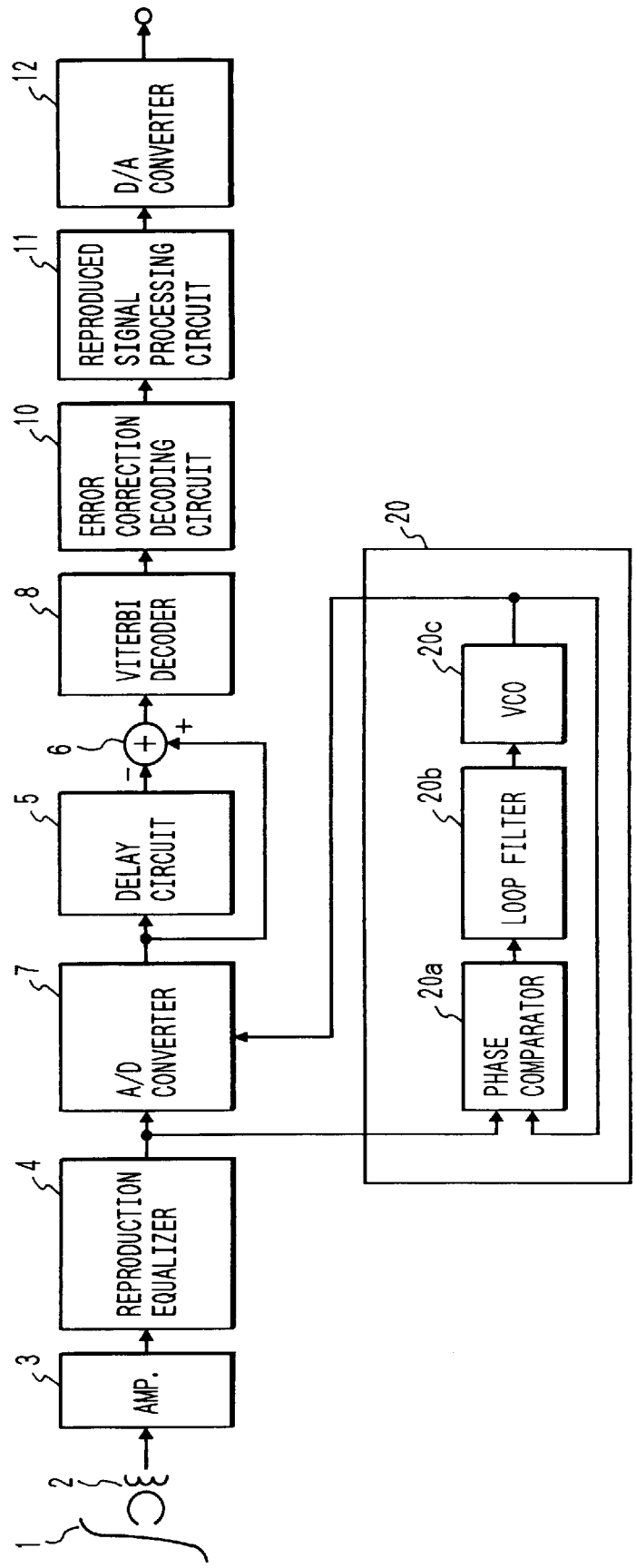
FIG. 7 is a diagram showing further another construction of the conventional digital VTR.

An apparatus of FIG. 15 differs with respect to a point that a digital phase detection circuit 30 is provided in place of the phase comparator 20a in FIG. 7. The digital phase detection circuit 30 comprises a pattern detection circuit 31 and a sample-hold circuit 32.

The digital data digitized by the A/D converter 7 is supplied to the pattern detection circuit 31 and a signal corresponding to the pattern of the data is generated. A PR(1, 0, −1) signal as an output of the subtracter 6 is supplied to the sample-hold circuit 32. The sample-hold circuit 32 samples and holds the PR(1, 0, −1) signal by being controlled by an output of the pattern detection circuit 31. By selecting a method of the pattern detection circuit 31, a signal corresponding to the phase difference between the reproduced data and the A/D conversion clock is obtained as an output of the sample-hold circuit 32.

Figure 16:
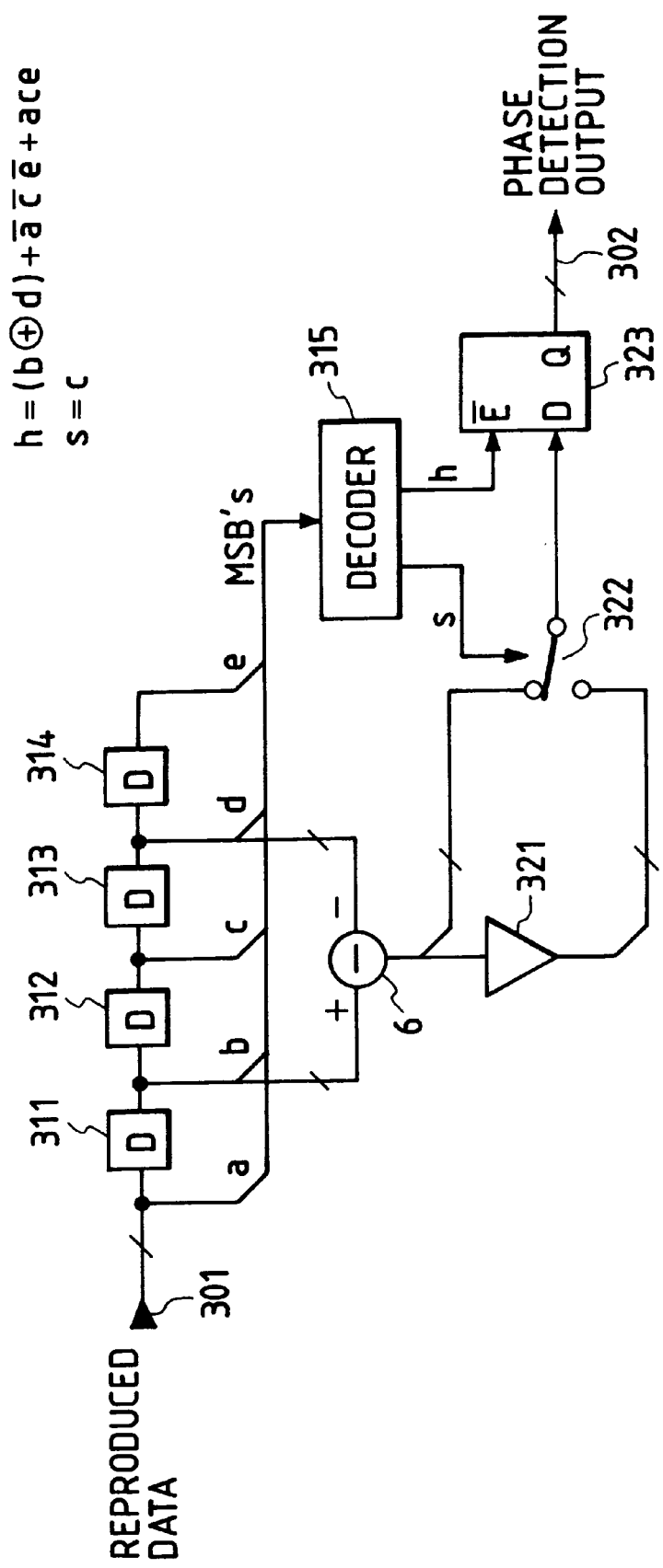
FIG. 16 is a diagram showing a construction of a digital phase detection circuit in FIG. 15.

FIG. 16 shows a specific constructional example of the digital phase detection circuit 30 and is constructed by including the delay circuit 5 and subtracter 6 in FIG. 15. In FIG. 16, reference numerals 311 to 31L4 denote delay circuits for delaying A/D converted reproduced data 301 every clock; 315 a decoder as logical arithmetic operating means for extracting a specific pattern from outputs of the delay circuits 311 to 314; 321 a code inversion circuit for inverting a code of the output of the subtracter 6 in FIG. 15; 322 a switch for switching the output of the subtracter 6 and an output of the code inversion circuit 321 by a signal (s) generated from the decoder 315; 323 a latch for sampling and holding an output of the switch 322 by a signal (h) generated from the decoder 315, thereby generating a phase detection output 302. Arithmetic operating means is constructed by the subtracter 6 and code inversion circuit 321.

In FIG. 16, the A/D converted reproduced data 301 is sequentially delayed by the delay circuits 311 to 314. The delay circuits 312 and 313 construct the delay circuit 5 and an output of the delay circuit 5 is subtracted by the subtracter 6 and becomes the PR(1, 0, −1) signal. In this instance, it is assumed that MSBs of input data and output data of the delay circuits 311 to 314 are set to (a), (b), (c), (d), and (e). When the reproduced data is A/D converted, if a mean value of those reproduced data is set so as to be located at the center of an A/D conversion range, so that (a), (b), (c), (d), and (e) become a binary data train obtained by integration detecting a reproduced data train. Such a data train is decoded by a specific logic by the decoder 315, thereby obtaining the signals (s) and (h).

The signal (s) controls the switch 322 so as to switch the output of the subtracter 6 and an output obtained by inverting the output of the subtracter 6 by the code inversion circuit 321. The signal (h) controls the latches 323 and allows an output of the switch 322 to be sampled and held.

A selecting method of the signals (s) and (h) will now be described.

FIG. 8 shows the eye-pattern of the PR(1, 0, −1) signal. Such an eye-pattern has three values at data detection points. When paying an attention to a zero-crossing point of the eye-pattern, it is known that a signal which passes through the zero-crossing point has an inclination proportional to a phase difference between the data and the detection point. Such an inclination has values of both of positive and negative. By performing predetermined logical arithmetic operations by the decoder 315 so that the signal (s) judges about the positive or negative of the inclination and that the signal (h) locates at the zero-crossing point, the phase detection output 302 of the digital phase detection circuit 30 is set to a value in which the average level is proportional to the phase difference between the data and the detection point.

As will be understood from the above eye-pattern, the inclination at the zero-crossing point has various values depending on the patterns of data and an inclination of phase comparison characteristics (phase detection sensitivity) is also fluctuated depending on the data patterns. In case of using in the loop of the PLL circuit, however, such an inclination causes only the fluctuation of the mean value of the loop gain, so that there is no problem.

As a method of obtaining the signals (s) and (h), according to the invention, the signals are obtained by performing the logical arithmetic operations from the integration detected data train. FIG. 17 shows an example of a truth table of (s) and (h).

In FIG. 17, (b–d), namely, an output of the subtracter 6 and logics of the signals (s) and (h) are shown for the integration detection data (a), (b), (c), (d), and (e). (s) denotes whether the inclination of (b–d) indicates positive or negative and (h) denotes whether (b–d) locates at the zero-crossing point or not. It will be understood that (s) and (h) can be expressed by simple logical arithmetic operations from the truth table. For example, they can be expressed as follows.

$$h=(b\oplus d)+\overline{a}\;\overline{c}\;e+a\;c\;\overline{e}$$

$$s=c$$

Where, ⊕ denotes EXOR.

Figure 18:
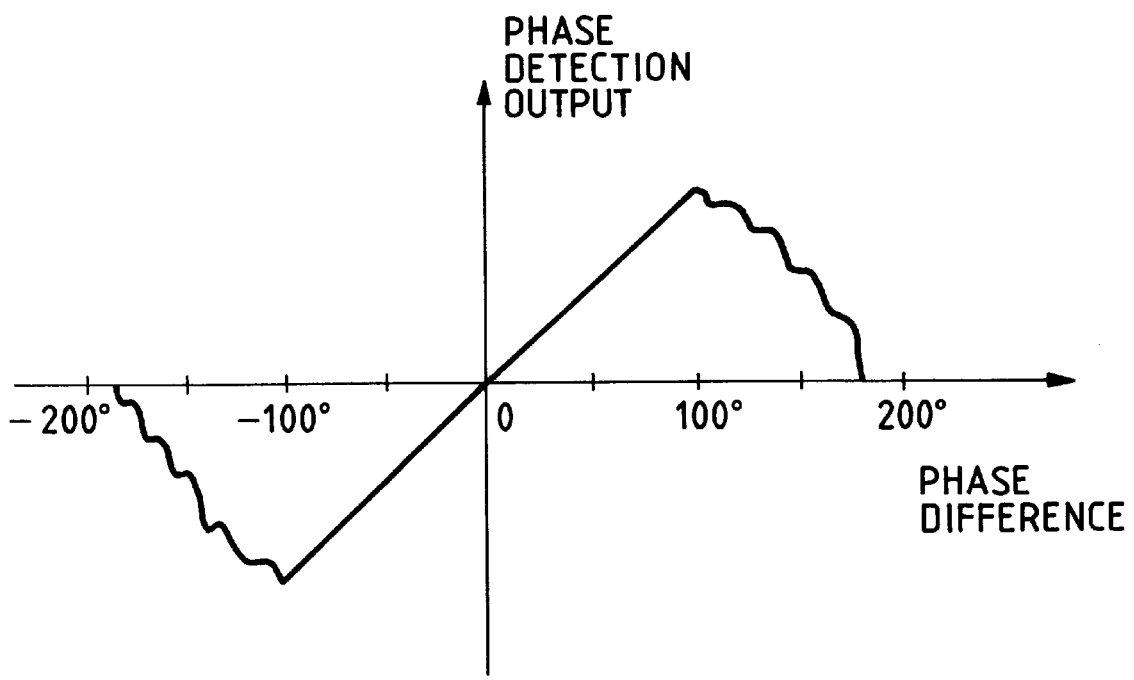
FIG. 18 is a diagram for explaining the operation of a PLL circuit in FIG. 16.

The above logics are satisfied in the case where no error exists in the integration detected data (a), (b), (c), (d), and (e). As the phase between the data and the clock is deviated, errors occur in data of the detection output 302. In this case, although the output of the digital phase detection circuit 30 is erroneously sampled, when paying an attention to the mean value, the mean value approaches 0 with an increase in errors. Thus, phase comparison characteristics as shown in FIG. 18 are obtained. In FIG. 18, linear comparison characteristics are obtained for a range of almost ±100°, so that an enough phase locked range is obtained as a PLL.

When the PLL circuit to extract the clock is constructed by using the digital phase detection circuit 30 like the embodiment, since the PR(1, 0, −1) data itself sampled by the clock is controlled so as to be settled to the zero-crossing point, there is no fluctuating factor of the locked phase, so that the adjustment is unnecessary. When the loop filter 20b is also realized by ea digital arithmetic operation, there is no DC offset or the like which causes a problem in an analog circuit, so that the adjustment of the PLL portion is almost unnecessary. The output of the VCO 20c is supplied as an operation clock to another predetermined circuit.

As mentioned above, according to the embodiment, since the phase detection output is directly obtained from the A/D converted data, the stability of the PLL circuit to extract the clock can be raised, a non-adjustment can be realized, and errors can be reduced.

In the above explanation, although the precision (the number of bits) of the arithmetic operation of the data, namely, by which number of bits per one sample the data is quantized by the A/D converter 7 has not been mentioned, generally, satisfactory characteristics (S/N ratio) are obtained by five bits or less. The number of bits can be decreased to about two bits in consideration of a performance, so that a circuit scale is also small.

According to the embodiments, although the case where the invention is applied to the digital VTR has been described as an example, the invention is not limited to those embodiments but can be also applied to a system for transmitting and reproducing binary data, for example, a communication (radio wave, optical, etc.) optical disc or the like. In this case, in accordance with a nature of each transmission path, for example, the detection of three values such as PR(1, −1), PR(1, 1), and the like other than PR(1, 0, −1) is selected and a digital phase detection circuit similar to that of the invention can be constructed.

Figure 19:
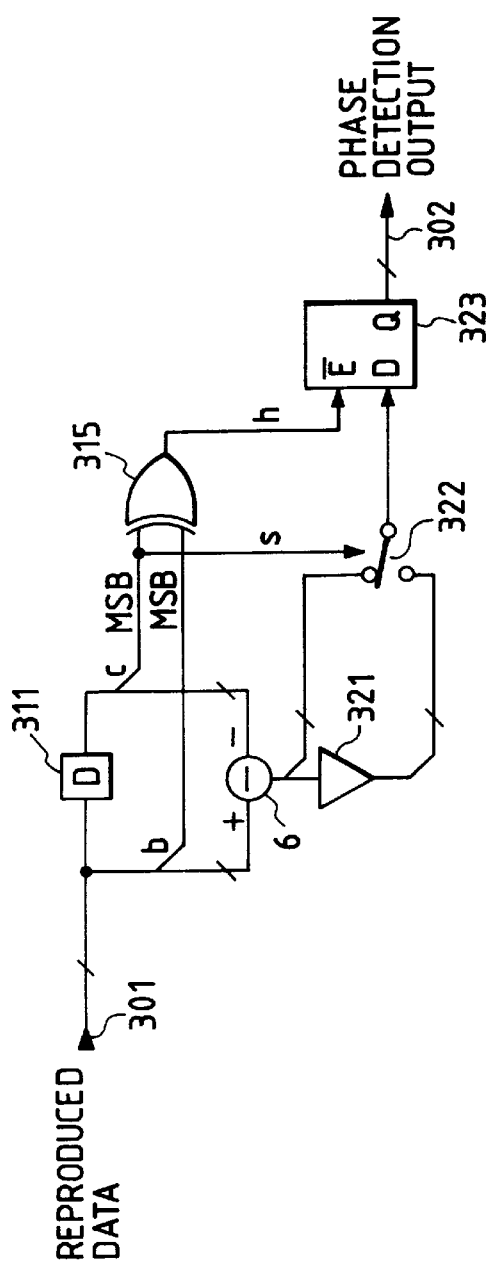
FIG. 19 is a diagram showing another construction of the digital phase detection circuit in FIG. 15.
Figure 20:
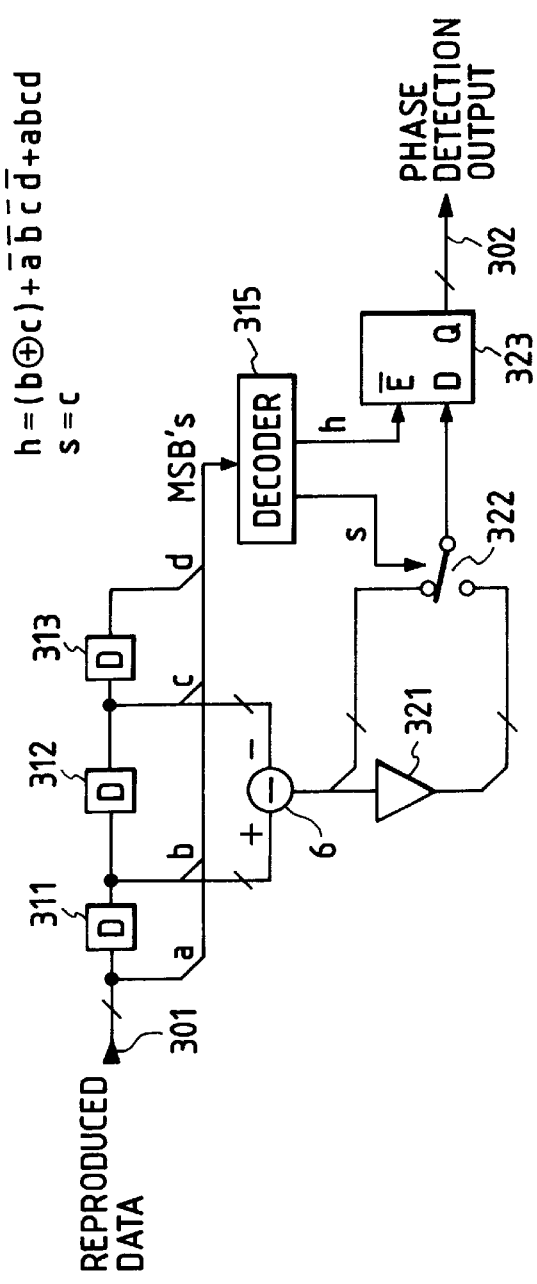
FIG. 20 is a diagram showing further another construction of the digital phase detection circuit in FIG. 15.

As examples, constructional examples of the digital phase detection circuit in case of PR(1, −1) are shown in FIGS. 19 and 20. FIGS. 19 and 20 are different with respect to a point that the subtracter 6 obtains a difference between the data and the data which was delayed by one clock and also they differ from the case where the logics of the decoder 315 are equal to PR(1, 0, −1) shown in FIG. 16.

That is, in FIG. 19, one delay circuit 311 is used, an EXOR (exclusive OR) gate is used as a decoder 315, the signal (h) is obtained by the MSBs (b) and (c) of an input and an output of the EXOR gate, and (c) is set to the signal (s). In FIG. 20, three delay circuits 311 to 313 are used and the delay outputs and the MSB of the reproduced data 301 are added as (a), (b), (c), and (d) to the decoder 315, so that the signals (s) and (h) are obtained by the logical expression shown in the diagram.

As described above, according to the foregoing embodiments, since the specific pattern in the input digital signal is detected and the clock is generated on the basis of the control signal which was formed on the basis of the difference between the digital signals extracted in response to the detection timings, there is an effect that the clock synchronized with the phase of the input digital signal can be formed.

By using the clock formed as mentioned above as a clock at the time of, for example, the A/D conversion, even in the case where the window width in the direction of the time base of the eye-pattern is narrow like the partial response system, since the phase of the A/D conversion clock can be optimized, there is an effect that the reproduced errors can be reduced.

According to the above embodiments, the apparatus is constructed in a manner such that the input digital signal is sequentially delayed every stage of each of the delay circuits by the clock, the (N) data of the delayed data and the input digital signal are judged in a binary manner, predetermined logical arithmetic operations are performed by using the N-bit data obtained by the result of the above judgment, a difference or sum of two data among the (N) data is obtained, a value of the difference or sum is latched in accordance with the result of the logical arithmetic operations, the oscillator is controlled by the latched value, and such an oscillation output is used as a clock in the signal processes. Therefore, since the phase detection output is directly obtained from the input digital signal, the clock can be stably extracted. Thus, there are effects that the non-adjustment can be realized and errors in the signal processes can be reduced.

What is claimed is:

1. A digital signal processing apparatus, comprising:
   (a) input means for inputting a signal including data and for converting the input signal into a digital signal;
   (b) detecting means for detecting a specific pattern in the data in the digital signal;
   (c) sampling means for sampling a digital signal included in the specific pattern in the data, which is detected by said detecting means, in the digital signal; and
   (d) generating means for generating a clock signal phase-synchronized with the input signal in accordance with an output of said sampling means.

2. An apparatus according to claim 1, wherein said input means performs a converting operation in accordance with the clock signal generated by said generating means.

3. An apparatus according to claim 1, wherein said detecting means detects a plurality of different patterns as the specific pattern.

4. An apparatus according to claim 1, wherein said generating means has extracting means for extracting a part of the input digital signal in accordance with an output of said detecting means, and wherein said sampling means samples and holds a difference between the digital signals extracted by said extracting means.

5. An apparatus according to claim 1, wherein said generating means includes a loop filter to which the output of said sampling means is supplied and oscillating means for generating a signal of a frequency corresponding to an output of said loop filter, and wherein an output of said oscillating means is generated as the clock signal.

6. Apparatus according to claim 1, wherein said input means includes converting means for sampling the input signal according to the clock signal generated by said generating means, and for converting the input signal into the digital signal of a plurality of bits per one sample.

7. Apparatus according to claim 6, further comprising data detection means for detecting a digital signal of a single bit per one sample from the digital signal of a plurality of bits per one sample output from said converting means.

8. Apparatus according to claim 1, wherein said input means includes reproducing means for reproducing the input signal from a recording medium.

9. Apparatus according to claim 1, further comprising processing means for processing the digital signal output from said input means, said processing means including decoding means for decoding the digital signal.

10. Apparatus according to claim 9, wherein an information amount of the digital signal is compressed, and wherein said processing means includes expanding means for expanding the information amount of the digital signal.

11. A digital signal processing apparatus, comprising:
  (a) converting means for sampling an input signal including data and for converting the input signal to a digital signal;
  (b) extracting means for detecting a specific pattern in the data in the digital signal by using data of N successive samples in the digital signal converted by said converting means, wherein N is greater than or equal to 3, and for extracting a signal having a value corresponding to a phase of the digital signal from a portion of the digital signal included in the specific pattern in the data; and
  (c) generating means for generating a clock signal whose phase is synchronized with the input signal, in accordance with an output of said extracting means,
  wherein said converting means performs the converting operation in response to the clock signal.

12. An apparatus according to claim 11, further comprising:
  delay means for delaying the digital signal from said converting means; and
  subtracting means for subtracting the digital signal outputted from said delay means from the digital signal outputted from said converting means.

13. An apparatus according to claim 12, wherein said extracting means detects a pattern such that zero-crossing points occur among a plurality of samples of the digital signals which are successively outputted from said subtracting means as the specific pattern.

14. An apparatus according to claim 11, wherein said extracting means detects a plurality of patterns which are different as the specific pattern.

15. An apparatus according to claim 11, wherein said generating means includes latch means for latching the digital signal outputted from said converting means in accordance with an output of said extracting means, a loop filter to which an output of said latch means is supplied, and oscillating means for generating a signal of a frequency corresponding to an output of said loop filter, and wherein said generating means generates an output of said oscillating means as the clock signal.

16. An apparatus according to claim 11, wherein said extracting means has delay means, connected at (N−1) stages for allowing the digital signal to be delayed by (N) clocks (N≧2), and wherein said extracting means binary-judges the data of (N+1) samples obtained from the input digital signal and the stages of said delay means, and detects the specific pattern by using data of (N+1) bits obtained as a judgment result.

17. A digital signal processing apparatus, comprising:
  (a) input means for inputting a digital signal including data having characteristics corresponding to a partial response (1, 0, −1);
  (b) detecting means for detecting a specific pattern in the data in the input digital signal and for discriminating whether there is a zero-crossing point of an eye-pattern of the input digital signal between two successive samples in the input digital signal, said detecting means outputting a discrimination signal according to the discriminating results;
  (c) sampling means for sampling a digital signal included in the specific pattern in the data in the input digital signal in response to the discriminating signal; and
  (d) generating means for generating a clock signal whose phase is synchronized with that of the input digital signal, in accordance with an output of said sampling means.

18. An apparatus according to claim 17, wherein said input means includes converting means for receiving a signal whose amplitude changes in an analog manner and for converting to the digital signal, and wherein said converting means performs a converting operation in accordance with the clock signal generated by said generating means.

19. An apparatus according to claim 16, wherein the input digital signal is a digital signal of a plurality of bits per one sample, and wherein said apparatus further comprises Viterbi decoding means for detecting the digital signal of one bit per one sample from the input digital signal by using a Viterbi algorithm.

20. An apparatus according to claim 16, wherein said input means includes reproducing means for reproducing the digital signal from a magnetic recording medium and equalizing means for equalizing the digital signal reproduced by said reproducing means, and wherein said equalizing means has equalizing characteristics to compensate characteristics of a magnetic recording and reproducing system.

21. An apparatus according to claim 17, wherein said input means has receiving means for receiving the digital signal and processing means for executing a process corresponding to a partial response (1, 0, −1) for the digital signal from said receiving means.

22. An apparatus according to claim 21, wherein said detecting means detects the specific pattern in the data in the digital signal, outputted from said receiving means.

23. A reproducing apparatus, comprising:
  (a) reproducing means for reproducing a signal including video data from a magnetic recording medium by using a head;
  (b) A/D conversion means for sampling the reproduced signal reproduced by said reproducing means and for converting each one of the samples into a digital signal of a plurality of bits;
  (c) detecting means for detecting a specific pattern in the video data in the digital signal converted by said A/D conversion means; and
  (d) clock generating means for generating a clock signal whose phase is synchronized with that of the reproduced signal, in accordance with an output of said detecting means, wherein said A/D conversion means performs the converting operation in response to the clock signal generated by s aid clock generating means.

24. An apparatus according to claim 23, further comprising:

a first equalizer for equalizing the video signal outputted from said reproducing means; and a second equalizer for equalizing a digital video signal outputted from said A/D conversion means, wherein said first equalizer has equalizing characteristics so as to compensate characteristics of a magnetic recording and reproducing system and wherein said second equalizer has characteristics corresponding to the partial response (1, 0, −1).

25. An apparatus according to claim 23, wherein said clock generating means has a latch circuit for latching the digital video signal outputted from said A/D conversion means in accordance with the output of said detecting means, a loop filter to which an output of said latch circuit is supplied, and a voltage controlled oscillator for generating a signal of a frequency corresponding to an output voltage of said loop filter, and wherein said clock generating means generates an output signal of said voltage controlled oscillator as the clock signal.

26. Apparatus according to claim 23, further comprising data detection means for detecting a single bit digital signal for one sample from the digital video signal converted by said A/D conversion means.

27. Apparatus according to claim 23, further comprising processing means for processing the digital signal converted by said A/D conversion means, said processing means including decoding means for decoding the digital signal.

28. A clock signal generating apparatus, comprising:

(a) delay means, connected at (N−1) stages for delaying an input digital signal by (N) clocks (N≧2);

(b) logical arithmetic operation means for binary-judging the digital signals of (N) samples composed of the input digital signal and the digital signals of (N−1) samples obtained from each stage of said delay means, respectively, and for performing predetermined logical arithmetic operations on data of (N) bits obtained as judgment results;

(c) arithmetic operation means for obtaining a sum or difference between two samples among the digital signals of (N) samples;

(d) latch means for latching an output of said arithmetic operation means, a latch operation being controlled by an operation result of said logical arithmetic operation means; and (e) generating means for generating a clock signal phase-synchronized with the input digital signal in accordance with an output of said latch means.

29. An apparatus according to claim 28, wherein said logical arithmetic operation means judges whether zero-crossing points exist among a plurality of successive samples in the input digital signal on the basis of the digital signals of (N) samples or not, and also judges positive or negative of an inclination among a plurality of samples which pass the zero-crossing points.

30. An apparatus according to claim 28, wherein said arithmetic operation means is constructed in a manner such that, in accordance with a judgment result about positive or negative of the plurality of samples by said logical arithmetic operation means, a polarity of the inclination can be inverted, and wherein said latch means performs the latch operation in accordance with the judgment result of the zero-crossing point by said logical arithmetic operation means.

31. An apparatus according to claim 21, further comprising converting means for sampling an input signal in accordance with the clock signal and for converting to a digital signal of a plurality of bits per one sample.

32. An apparatus according to claim 31, wherein the data of (N) bits is constructed by the most significant bits of the digital signals of (N) samples.

33. An image signal reproducing apparatus, comprising:

(a) reproducing means for reproducing an image signal including image data, (b) an integral equalizer for performing an integral equalizing operation on the reproduced image signal;

(c) converting means for sampling the image signal equalized by said integral equalizer and for converting the sampled image signal into a multi-bit digital image signal for one sample;

(d) partial response processing means for processing the digital image signal converted by said converting means to output the image signal having a partial response characteristic;

(e) Viterbi decoding means for detecting a single-bit digital image signal for one sample from the multi-bit digital image signal output from said partial response processing means by using a Viterbi decoding algorithm;

(f) pattern detection means for detecting a specific pattern in the image data from an output of said converting means and for sampling an output of said partial response processing means in response to a pattern detection output; and (g) clock generating means for generating a clock signal according to an output of said pattern detection means, wherein said converting means samples the image signal equalized by said integral equalizer in response to the clock signal.

34. An apparatus according to claim 33, wherein said pattern detection means detects a pattern such that a zero-cross point of an eye-pattern of the multi-bit digital image signal output from said partial response processing means occurs between two samples of the multi-bit digital image signal output from said partial response processing means as the specific pattern.

35. An apparatus according to claim 33, wherein said pattern detection means detects a plurality of patterns different from each other as the specific pattern.

36. An apparatus according to claim 33, wherein said partial response processing means includes delay means for delaying the image signal output from said converting means and subtracting means for obtaining a difference signal between the image signal to be output to said delay means from said converting means and an output from said delay means.

* * * * *

UNITED STATES PATENT AND TRADEMARK OFFICE
CERTIFICATE OF CORRECTION

PATENT NO. : 6,118,606

DATED : September 12, 2000

INVENTOR(S): YOSHIYUKI SASAKI, ET AL.

It is certified that error appears in the above-identified patent and that said Letters Patent is hereby corrected as shown below:

COLUMN 2
    Line 46, "being" should be deleted.

COLUMN 6
    Line 16, "vralues" should read --values--.

COLUMN 8
    Line 8, "31L4" should read --314--.

COLUMN 9
    Line 23, "an" should be deleted.
    Line 28, "an" should be deleted.

COLUMN 12
    Line 33, "claim 16," should read --claim 17,--.
    Line 39, "claim 16," should read --claim 17,--.

UNITED STATES PATENT AND TRADEMARK OFFICE
CERTIFICATE OF CORRECTION

PATENT NO. : 6,118,606

DATED : September 12, 2000

INVENTOR(S): YOSHIYUKI SASAKI, ET AL.

Page 2 of 2

It is certified that error appears in the above-identified patent and that said Letters Patent is hereby corrected as shown below:

COLUMN 13
    Line 5, "s aid" should read --said--.

Signed and Sealed this

Fifteenth Day of May, 2001

Attest:

NICHOLAS P. GODICI

Attesting Officer          Acting Director of the United States Patent and Trademark Office